US012791605B2

(12) United States Patent
Riedmann et al.

(10) Patent No.: US 12,791,605 B2
(45) Date of Patent: Nov. 10, 2026

(54) CONFIGURABLE RADIO FREQUENCY SYSTEM

(71) Applicant: Rohde & Schwarz GmbH & Co. KG, Munich (DE)

(72) Inventors: Nico Riedmann, Munich (DE); Robert Ziegler, Surberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 154 days.

(21) Appl. No.: 18/787,682

(22) Filed: Jul. 29, 2024

(65) Prior Publication Data

US 2025/0130273 A1 Apr. 24, 2025

(30) Foreign Application Priority Data

Oct. 19, 2023 (EP) .................................... 23204527

(51) Int. Cl.
*G01R 27/00* (2006.01)
*G01R 27/28* (2006.01)
(Continued)

(52) U.S. Cl.
CPC ......... *G01R 31/2822* (2013.01); *G01R 27/28* (2013.01); *G01R 23/16* (2013.01)

(58) Field of Classification Search
CPC ........ G01R 27/04; G01R 27/28; G01R 27/32; G01R 31/2822; G01R 31/2844; G01R 31/2889; G01R 23/16
See application file for complete search history.

(56) References Cited

U.S. PATENT DOCUMENTS 5,578,932 A * 11/1996 Adamian ............. G01R 35/005 324/73.1
11,913,987 B2 * 2/2024 Hantsch ........... G01R 31/31716
(Continued)

FOREIGN PATENT DOCUMENTS

| | | |
|---|---|---|
| CN | 103592547 A | 2/2014 |
| CN | 205992026 U | 3/2017 |
| GB | 2409049 A | 6/2005 |

OTHER PUBLICATIONS

Office Action for related European Application No. 23204527.8-1001, dated Apr. 16, 2024, 12 pages.
(Continued)

*Primary Examiner* — Thang X Le
(74) *Attorney, Agent, or Firm* — DITTHAVONG. STEINER & MLOTKOWSKI

(57) ABSTRACT

The invention relates to configurable radio frequency, RF, system. The RF system comprises: a first RF module which comprises a signal path and an RF port; wherein the RF port is arranged for being connected to a further RF module or to a device-under-test, DUT; wherein the first RF module further comprises at least a first and a second auxiliary port which are accessible from outside the first RF module; wherein the first and the second auxiliary port are arranged for being connected to each other via: a first bridging element or a first extension module of the configurable RF system; and wherein the signal path is connected to the RF port and passes through: the first auxiliary port, the first bridging element or the first extension module, and the second auxiliary port.

18 Claims, 4 Drawing Sheets

(51) Int. Cl.
*G01R 31/28* (2006.01)
*G01R 23/16* (2006.01)

(56) References Cited

U.S. PATENT DOCUMENTS

| | | | | |
|---|---|---|---|---|
| 2004/0010384 | A1 | 1/2004 | Jacobsen et al. | |
| 2004/0201383 | A1 | 10/2004 | Anderson | |
| 2006/0282723 | A1 | 12/2006 | Pleasant et al. | |
| 2009/0111394 | A1* | 4/2009 | Vajha | H03B 5/1852 455/90.2 |
| 2016/0204881 | A1* | 7/2016 | Chung | H04B 17/00 455/67.14 |
| 2016/0259700 | A1 | 9/2016 | Volkmann et al. | |
| 2019/0219612 | A1 | 7/2019 | Gottfried et al. | |
| 2024/0402239 | A1* | 12/2024 | Fitzgerald | G01R 1/07385 |
| 2025/0052807 | A1* | 2/2025 | Harms | G01R 31/2822 |

OTHER PUBLICATIONS

Horibe et al., "Consideration of error model with cable flexure influences on waveguide vector network analyzers at submillimeter-wave frequency", 2015 85th Microwave Measurement Conference (ARFTG), IEEE, May 22, 2015 (May 22, 2015), pp. 1-8.

Rohde & Schwarz, "R&S ZVA Vector Network Analyzer", Dec. 1, 2017 (Dec. 1, 2017), XP093148063, Retrieved from the Internet: https://scdn.rohde-schwarz.com/ur/pws/dl_downloads/dl_common_library/dl_brochuresanddatasheets/pdf_I/ZVA bro_en_5213-568 0-12_y1300.pdf, 32 pages.

Rohde & Schwarz, "New Vector Network Analyzer Masters Complex Measurements", Microwave Journal, May 14, 2019, Retrieved from https://www.microwavejournal.com/articles/32239-new-vector-network-analyzer-masters-complex-measurements, 11 pages.

Dreamcatcher, "Quick start guide", Dec. 28, 2009 (Dec. 28, 2009), XP093146972, Retrieved from the Internet: U'RL:https://biblus.us.es/bibing/proyectos/abreproy/12182/fichero/anexos%2FStartGuide.pdf [retrieved on Apr. 2, 2024].

Turkmen et al., "A SiGe BiCMOS W-Band Single-Chip Frequency Extension Module for VNAs", IEEE Transactions on Microwave Theory and Techniques, IEEE, USA, vol. 68, No. 1, Dec. 19, 2019 (Dec. 19, 2019), pp. 211-221.

Horibe et al., "Vector Network Analyzer Calibration for Characterization of Packaged Power MOSFET Device at RF Frequency", 2020 95th ARFTG Microwave Measurement Conference (ARFTG), IEEE, Aug. 4, 2020 (Aug. 4, 2020), pp. 1-4.

* cited by examiner

CONFIGURABLE RADIO FREQUENCY SYSTEM

RELATED APPLICATION

This application claims priority benefit from European Patent No. 23 204 527.8 filed Oct. 19, 2024, the contents of which are incorporated by reference herein in their entirety.

TECHNICAL FIELD OF THE INVENTION

The invention relates to a configurable RF system, in particular a frontend system for a test and/or measurement device such as a spectrum analyzer or a signal generator.

BACKGROUND OF THE INVENTION

Test and/or measurement devices, such as spectrum or network analyzers, can be used for characterizing so called devices-under-test (DUTs). The DUTs can be waveguide modules or substrate-based circuits, e.g. MMICs (Monolithic Microwave Integrated Circuits), which operate with millimeter wave (mmW) signals. In case of an MMIC, various measurements are often carried out at different test points in the circuit.

Depending on the type of the characterization measurement and the parameters to be measured, different measurement devices and frontends (e.g., mmW converters) are thereby used.

For instance, in case of low or high signal S-parameter measurements or measurements of certain wave-parameters of an mmW DUT, a network analyzer and two mmW converters may be used. Often, an additional amplifier is connected to the setup, as the output r of the mmW converters may not be sufficient for many power measurements. This can, however, reduce the directivity of the mmW converters, i.e. the DUT can no longer be characterized with respect to the input reflection coefficient. In addition, the source signal may no longer be measurable via the directional coupler. Thus, the amplifier is not used for all measurements.

For noise measurements, in contrast, a network analyzer and two mmW converter or a spectrum analyzer, a mixer, and a noise source may be used; and for linearity measurements, a network analyzer and two or three mmW converters may be used. For measuring other parameters and signals (e.g., EVM, IQ charts, RF spectra, modulated signals, etc.), additional devices and frontends (e.g., vector signal generators) might be required.

Thus, a measurement setup often has to be changed when performing new measurements. For instance, external frontends are swapped or additional devices are connected. This is cumbersome and time consuming. Further, a new calibration of the setup is often repeated every time the setup is changed, causing additional efforts.

Thus, it is an objective to provide a configurable RF system which avoids the above mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the invention refers to a configurable radio frequency, RF, system. The configurable RF system comprises: a first RF module which comprises a signal path and an RF port; wherein the RF port is arranged for being connected to a further RF module or to a device-under-test, DUT; wherein the first RF module further comprises at least a first and a second auxiliary port which are accessible from outside the first RF module; wherein the first and the second auxiliary port are arranged for being connected to each other via: a first bridging element or a first extension module of the configurable RF system; wherein the signal path is connected to the RF port and passes through: the first auxiliary port, the first bridging element or the first extension module, and the second auxiliary port.

This achieves the advantage that a configurable RF system is provided which can be used together with different test and/or measurement devices. The system can be reconfigured depending on the use case and application, by connecting different extension modules or bridging elements. This can be done manually or automatically.

The RF system can be a frontend system, which is connected between the test and/or measurement device (e.g., a VNA, a network analyzer, a signal generator or a spectrum analyzer) and a device-under-test (DUT) and which can forward RF signals between these devices.

In particular, the configurable RF system provides a universal usability (i.e., it can be used with different test/measurement devices and for different measurements) and, thus, reduces the number of frontends required by a user. This also saves the time that is required for a conversion of a conventional measurement setup with different frontends.

The RF system can be suitable for RF signals in an mmW wavelength range (mmW signals). Thus, the configurable RF system can form an mmW frontend system.

The signal path can be an RF signal part. For example, the signal path is formed by or comprises an RF waveguide, in particular for mmW signals. The RF waveguide can be a rectangular metallic waveguide.

The RF port can be used to connect the first RF module to another module or to the device-under-test. The RF port can be a main port of the first RF module.

The first bridging element can be a bridge-like-element that connects the first and the second auxiliary port. The birding element can form a bypass element.

The first and the second auxiliary port can be a part of an interface of the first RF module. The interface may comprise two or more than two auxiliary ports.

The at least first and second auxiliary port being accessible from the outside of the first RF module may refer to the ports being accessible from the outside of a housing of the first RF module.

In an embodiment, the first RF module comprises at least a third and a fourth auxiliary port which are accessible from outside the first RF module; wherein the third and the fourth auxiliary port are arranged for being connected to each other via: a second bridging element or the first extension module or a second extension module of the configurable RF system; wherein the signal path further passes through: the third auxiliary port, the second bridging element or the first extension module or the second extension module, and the fourth auxiliary port.

This achieves the advantage that different extensions modules that utilize up to four ports can be connected to the RF module.

For instance, the RF port and/or the auxiliary ports can comprise respective waveguide flanges, or coaxial interfaces or ports. The third and the fourth auxiliary port can be part of the interface of the first RF module.

In an embodiment, at least a part of the signal path between the first auxiliary port and the fourth auxiliary port runs through the first RF module.

In an embodiment, the first RF module comprises an electronic device, in particular an amplifier unit; wherein the part of the signal path that runs through the first RF module passes through the electronic device.

For instance, the amplifier unit comprises one or more amplifiers.

In an embedment, the first extension module comprises at least one of the following elements: the first bridging element, an amplifier stage, a switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, a combiner, and/or a DUT port.

This achieves the advantage that the functionality of the first RF module can be extended, depending on the requirements of a measurement, by connecting a suitable extension module. The first extension module may further comprise the second bridging element.

In an embodiment, the first extension module comprises a feeding port configured to receive an RF signal; wherein the first extension module is configured to transmit the RF signal to the RF port of the first RF module.

In an embodiment, the first RF module is a transmitter module and/or a receiver module. For instance, the first RF module can be a transceiver module.

For instance, if an RF module is configured as a receiver module, it receives RF signals via its RF port (e.g., from a connected DUT) and forwards said RF signals to a test and/or measurement device. If an RF module is configured as a transmitter module, it receives RF signals from the test and/or measurement device and forwards said RF signals via the RF port to the DUT.

In an embodiment, the configurable RF system may further comprise: a second RF module which comprises a further signal path and a further RF port; wherein the further RF port of the second RF module is arranged for being connected to the further RF module or to the DUT or to another DUT; wherein the second RF module further comprises at least a further first and a further second auxiliary port which are accessible from outside the second RF module, wherein the further first and the further second auxiliary port are arranged for being connected to each other via: a third bridging element or a third extension module of the configurable RF system; wherein the further signal path is connected to the further RF port and passes through: the further first auxiliary port, the third bridging element or the third extension module, and the further second auxiliary port.

The second RF module may be a transmitter module and/or a receiver module.

For instance, the first RF module can be a receiver module which is limited to a receiver function and the second RF module can be a transmitter module which is limited to a transmitter function, or vice versa. Alternatively, both the first and the second RF module can be transmitter or receiver modules.

The at least first and second further auxiliary ports being accessible from the outside of the second RF module may refer to the ports being accessible from the outside of a housing of the second RF module.

In an embodiment, the second RF module comprises at least a further third and a further fourth auxiliary port which are accessible from outside the second RF module; wherein the further third and the further fourth auxiliary port are arranged for being connected to each other via: a fourth bridging element or the third extension module or a fourth extension module of the configurable RF system; wherein the further signal path further passes through: the further third auxiliary port, the fourth bridging element or the third extension module or the fourth extension module, and the further fourth auxiliary port.

In an embodiment, at least a part of the further signal path between the further first auxiliary port and the further fourth auxiliary port runs through the second RF module.

In an embodiment, the second RF module comprises a further electronic device, in particular an amplifier unit; wherein the part of the further signal path that runs through the second RF module passes through the further electronic device.

In an embodiment, the third extension module comprises at least one of the following elements: the third bridging element, an amplifier stage, a switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, a combiner, and/or a DUT port.

In an embodiment, the third extension module comprises a receiving port configured to output an RF signal which is transmitted via the further signal path of the second RF module.

This achieves the advantage that RF signals can be outputted by the second RF module (e.g., a transmitter or receiver module) via the extension modules, e.g., for further processing.

In an embodiment, the first RF module and the second RF module are arranged in a common housing or within separate housings.

The second RF module can be attached to the first RF module. For instance, the first RF module and the second RF module are attached to each other on their respective side surfaces.

In an embodiment, the first RF module further comprises at least one of: a data interface, a coaxial interface, a supply voltage interface; and/or the second RF module comprises at least one of: a data interface, a coaxial interface, or a supply voltage interface.

The supply voltage interface can be a DC interface.

In an embodiment, the first and the second RF module are screwed and/or clipped together; and/or the configurable RF system comprises a data connection and/or a supply voltage connection which connects the first RF module with the second RF module.

In an embodiment, the first extension module is removably attached to the first RF module by means of a plug-in connection, a screw connection or a magnetic connection.

In an embodiment, the first RF module comprises a plurality of sub-modules.

For example, each sub-module comprises two auxiliary ports the same is also true for the second RF module. Each sub-module can have a separate housing.

In an embodiment, the first bridging element or the first extension module can be swapped with a different bridging element or extension module during operation of the configurable RF system.

For instance, during operation means while the DUT stays connected to the RF system. The system can automatically detect a new bridging element or extension module.

BRIEF DESCRIPTION OF THE DRAWINGS

The invention will be explained in the following together with the figures.

DETAILED DESCRIPTION OF THE PREFERRED EMBODIMENTS

Figure 1:
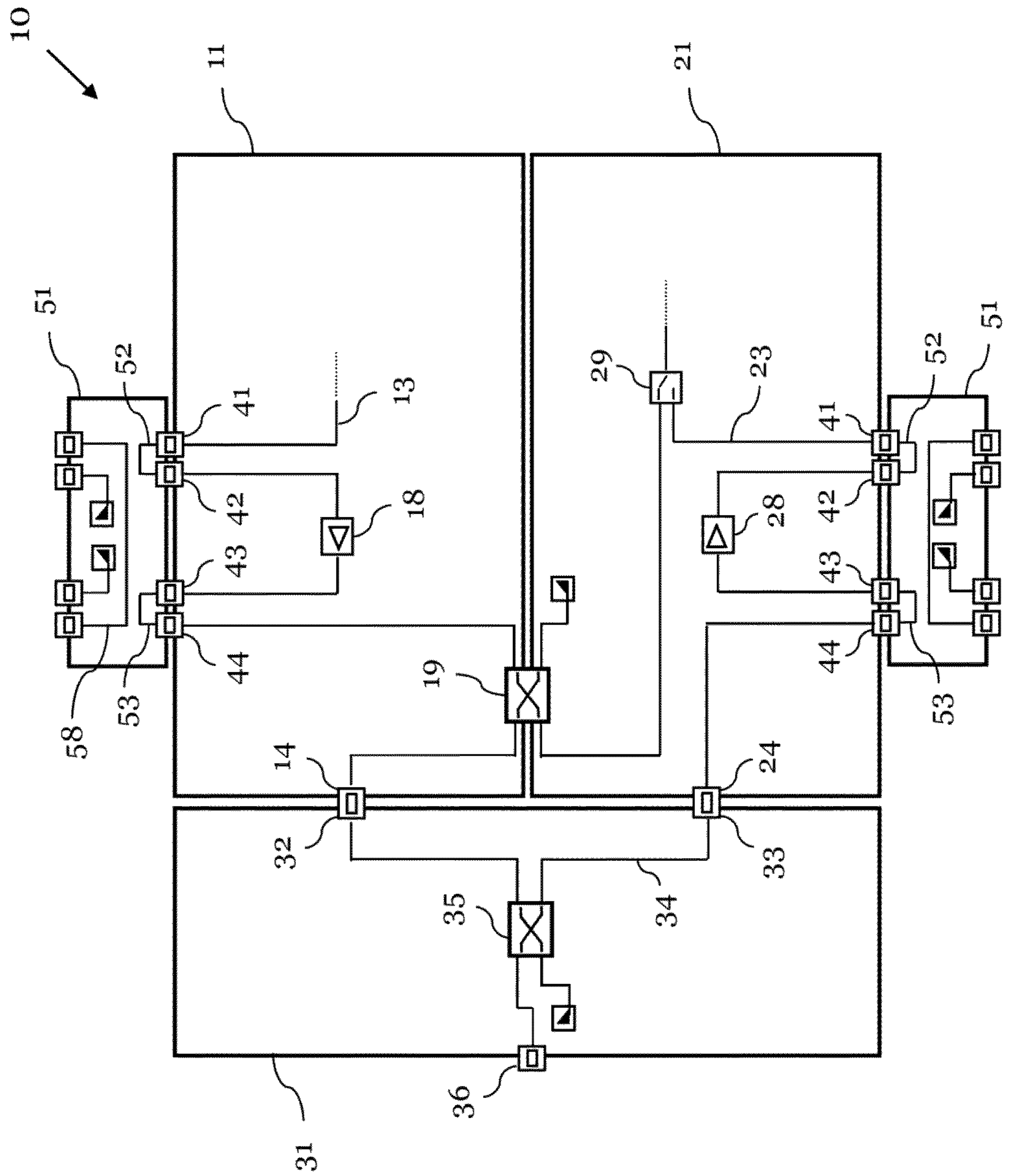
FIG. 1 shows a schematic diagram of a configurable RF system according to an embodiment.

FIG. 1 shows a schematic diagram of a configurable and/or modular RF system 10 according to an embodiment.

The configurable RF system 10 comprises: a first RF module 11 which comprises a signal path 13 and an RF port 14; wherein the RF port 14 is arranged for being connected to a further RF module 31 or to a device-under-test (DUT). The first RF module 11 further comprises at least a first and a second auxiliary port 41, 42 which are accessible from outside the first RF module 11; wherein the first and the second auxiliary port 41, 42 are arranged for being connected to each other via: a first bridging element 52 or a first extension module 51 of the configurable RF system 10. The signal path 13 is connected to the RF port 14 and passes through the first auxiliary port 41, and through the first bridging element 52 or the first extension module 51. The signal path 13 further passes through the second auxiliary port 42.

As shown in FIG. 1, the first RF module 11 may further comprise at least a third and a fourth auxiliary port 43, 44 which are also accessible from outside the first RF module 11. Also, this third and fourth auxiliary ports 43, 44 can be arranged for being connected to each other via: a second bridging element 43, or the first extension module 51, or a second extension module (not shown) of the configurable RF system. As shown in FIG. 1, the signal path 13 of the first RF module 11 may pass through said third auxiliary port, and may further pass through the second bridging element 53 or the first extension module 51 or the (not shown) second extension module. Further, the signal path 13 may pass through the fourth auxiliary port 44.

The auxiliary ports 41, 42, 43, 44 can form an interface of the first RF module for connecting the first extension module 51 and/or the bridging element(s) 52, 53. In this way, the signal path can be "guided" out of the RF module 11 and into the extension module 51, where additional signal processing or conditioning steps can be carried out.

As can be seen in FIG. 1, the RF system 10 may comprise an optional second RF module 21 which comprises a (further) signal path 23 and a (further) RF port 24 which is arranged for being connected to the further (i.e., third) RF module 31 or to the DUT.

The second RF module 21 may have a partially equivalent design to the first RF module 11, and may also comprise: at least a (further) first and a (further) second auxiliary port 41, 42 which are accessible from outside the second RF module 21, wherein the (further) first and the (further) second auxiliary port 41, 42 are arranged for being connected to each other via: a (third) bridging element 52 or a (third) extension module 51 of the configurable RF system 10. The further signal path 23 can be connected to the further RF port 24 of the second RF module 21 and can pass through: the (further) first auxiliary port 41, and further pass through the (third) bridging element 52 or the (third) extension module 51. The further signal path 23 may further pass through the further second auxiliary port 44.

Similar to the first RF module 11, also the second RF module 21 may comprise (further) third and fourth auxiliary ports 44, 43 which are accessible from outside the second RF module 21. The (further) third and fourth auxiliary ports 44, 43 can be arranged for being connected to each other via: a (fourth) bridging element 53, or the (third) extension module 51, or a fourth extension module (not shown). The further signal path 53 can pass through the further third auxiliary port 43, and can further pass through the fourth bridging element 53 or the third extension module 51 or the fourth extension module. The further signal path 23 can further pass through the further fourth auxiliary port 44.

In particular, auxiliary ports 41, 42, 43, 44 being accessible from the outside of an RF modules 11, 12 means that the ports 41, 42, 43, 44 are accessible from outside of the respective housing of the RF modules 11, 12.

The configurable and/or modular RF system 10 can be a frontend system which is arranged between a test and/or measurement device and the DUT (not shown in FIG. 1).

The RF system 10 can be configured to forward RF signals, in particular mmW signals, between the test and/or measurement device 72 and the DUT 71.

The respective signal paths 13, 23 of the first and/or the second RF module 11, 21 can be RF signal paths. For example, each signal paths 13, 23 is designed as an RF waveguide, in particular a waveguide for guiding mmW radiation. The RF waveguides can be rectangular metallic waveguides.

Each of the RF ports and/or auxiliary ports 14, 24, 41, 42, 43, 44 of the first and/or the second RF module 11, 21 can comprise waveguide flanges. Alternatively, each of these interfaces can also be coaxial interfaces.

For example, the first RF module 11 can be a transmitter (Tx) module and the second RF module 21 can be a receiver (Rx) module. Alternatively, also both RF modules 11, 21 can be Rx or Tx modules.

The first RF module 11 and the second RF module 21 can be arranged in a common housing or within separate housings.

For instance, the first and the second RF module 11, 21 can be screwed and/or clipped together. Alternatively or additionally, the configurable RF system 10 comprises a data connection and/or a supply voltage connection which connects the first RF module 11 with the second RF module 21.

Furthermore, a coupling element 19 can be arranged at an interface of the first and the second RF module 11, 21 and can be connected to the respective signal paths 13, 23 of the modules 11, 21. For instance, via this coupling element 19 at least a part of an RF signal can be coupled from a signal path of one RF module to the signal path of the other RF module.

For instance, in this way a Tx signal could be coupled from the Tx module (e.g., in FIG. 1 the first module 11) to the Rx module (e.g., in FIG. 1 the second module 21). A switch in the second module 21 can be arranged to selectively forward the thus received Tx signal portion or an Rx signal received via the RF port 24 to a connected test and/or measurement device.

For instance, in an Rx/Tx arrangement, the coupled out signal part can be used as a reference receiver signal for a VNA (vector network analyzer) frontend or for analyzing the output signal of the Tx module (e.g., for digital pre-distortion of a modulated/broadband TX signal). In a Tx/Tx arrangement, this connection allows a combining of two signal sources for generating a two- or more-tone signal.

The coupling element 19 can be a coupler, a combiner, a splitter or a switch. The coupling element 19 can be arranged in or at a connection surface of the first and the second RF module 11, 21.

The first and/or the second RF module 11, 21 can be connected to a DUT via the third RF module 31. For instance, the DUT is connected to an RF port 36 of the third RF module 31. The third RF module 31 can offer full or half duplex functionality, i.e., it can selectively connect one of the two RF systems 11, 21 or both RF system 11, 21 to the DUT via an element 35 (e.g., a switch, a coupler combiner, a splitter, or a multiplexer).

The full duplex capability of the system 10 can be deactivated when the third RF module 31 is removed, e.g. to achieve a maximal output power level of a TX module or a particularly low noise figure of an RX module.

Aa shown in FIG. 1, the respective signal paths 13, 23 of the first and/or the second RF module 11, 21 can be arranged such that at least a part of the signal path 13, 23 between the first and fourth auxiliary port 41, 44 loops through the first respectively second RF module 11, 21.

For instance, an electronic device 18, 28, such as an amplifier unit or an attenuator unit, can be arranged in the first and/or second RF module, such that the part of the signal path 13, 23 (that loops through the RF module) passes through the electronic device 18, 28. For instance, in this way, an RF signal transmitted by or received by an RF module 11, 21 can be amplified or attenuated.

The electronic device 18, 28 can comprise a filter unit, a phase shifter, an isolator, a circulator, a power detector, a mixer, a signal and/or noise source, a modulator, a coupler unit, a splitter, a combiner and/or an RF line.

The first RF module 11 and/or the second RF module 21 may comprises a plurality of sub-modules. For example, each sub-module comprises two of the auxiliary ports 41, 42, 43, 44. Each sub-module can have a separate housing.

Preferably, the extension modules 51, which can be connected to the first and/or second RF module 11, 21 via the auxiliary ports 41-44 expand the functionality of the RF modules 11, 21.

For instance, each of the extension modules 51 may comprises at least one of the following elements: an amplifier stage, switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, and/or a combiner.

Furthermore, the bridging elements 52, 53, which can be bridge-like elements that directly connect two auxiliary ports, may be comprised by the extension modules (as shown in FIG. 1).

In this way, a user or operator can easily adapt and/or configure the RF system 10 by connecting a suitable extension module 51 to any one of the RF modules 11, 21. For instance, different extension modules 51 can be connected to the first and the second RF module 21 depending on the measurement requirements. Thus, the RF system 10 can be modular system that can be quickly adapted by connecting suitable extension modules 51.

Note that the extension modules 51 connected to both RF modules 11, 21 in FIG. 1 are only an example. A plurality of different extension modules (as e.g. shown in FIGS. 2A-D), which offer different functionalities, can be provided and can be connected to the first and/or to the second RF module 11, 21, depending on the requirements.

Thereby, each of the extension modules 51 can be removably attached to the first respectively second RF module 11, 21, e.g. by means of a plug-in connection, a screw connection or a magnetic connection.

For example, the first extension module 51 is screwed to the first RF module 11; or the first extension module 51 and the first RF module 11 are magnetically forced together. The magnetic attachment may replace a screw connection and allows for an easy mounting/replacement of the extension module e51 without needing special tools. The (third) extension module 51 can be attached to the second RF module 21 in the same way.

Further implementation examples/approaches for attaching the extension modules 51 to the first and/or the second RF module 11, 21 may comprise: a toggle press, a snap lock, a clamping device based on rotation, or a hand screw or knob.

In general, the first and/or second RF module 11, 21 comprises at least one auxiliary port 41-44 which is connected to the respective signal path 13, 23 of the module 11, 21. This auxiliary port can be used to couple additional RF signals into or out of the respective signal path 13, 23.

For example, the Tx module (e.g., first RF module 11 in FIG. 1) may comprise an internal switch which switches the RF port 14 between a port connected to a test and/or measurement device and one of the auxiliary ports 41-44 which receives the external signal. For example, a noise source could be connected to this auxiliary port or to the extension module 51 connected to this auxiliary port. This enables, for example, a comprehensive characterization of the DUT (e.g., chips/MMICs on a wafer prober system) without disconnecting the DUT and/or without modifying the measurement setup. For instance, the TX module 11 can generate and/or forward CW (continuous wave) signals and/or broadband signals, e.g. for S-parameter, large signal or linearity measurements. Furthermore, the TX module 11 could provide a noise source which can be switched on the RF port 14.

The Rx module (e.g., the second RF module 21 in FIG. 1) could comprise an additional switch which could switch an output port (connected to the test and/or measurement device) between the signal path 23 connected to the RF port 24 and an auxiliary port 41-44. For instance, an external power meter (for calibration) could be connected to this auxiliary port.

In case the first and/or second RF module 11, 21 comprise two or more auxiliary ports 41-44, as shown in FIG. 1, different external modules 51 can be connected to the first and/or second RF module 11, 21 which expand the functionality of these RF module.

For instance, the extension modules 51 can connect at least one of the following elements to a signal path of an RF module: an additional output amplifier to a TX signal path or an LNA (low noise amplifier) to an RX signal path, a mixer, a level detector, a switch, one or more attenuators, a filter, a coupler, a splitter, an isolator, a phase shifter, a circulator, a power detector, a modulator, a combiner, a load tuner, or a source tuner. In this way, a functionality and/or performance of an RF module 11, 21 can be enhanced.

If an RF module has four auxiliary ports 41-44 (as the modules 11, 21 shown in FIG. 1), a bypassing of an internal function block of the module (e.g., an external stage in a Tx module) via a selective connection of auxiliary ports with a bridging element is possible.

FIGS. 2A-D show schematic diagrams of different extension modules 51 according to an embodiment. For instance, each of the modules 51 shown in FIGS. 2A-D can be connected to the auxiliary ports 41-44 of the first and/or the second RF module 11, 21 in FIG. 1.

Figure 2A:
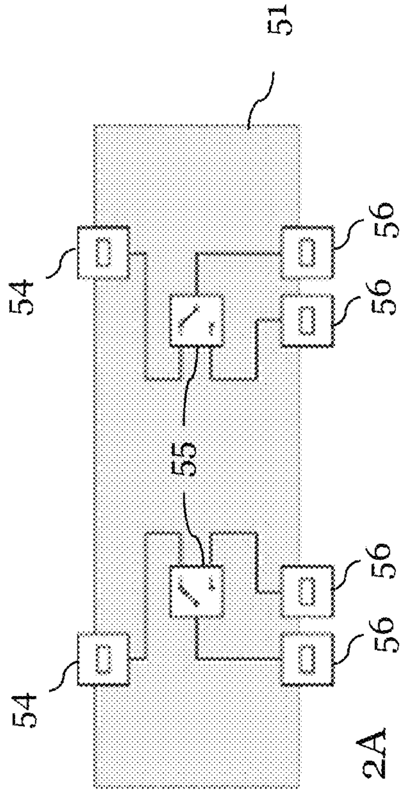
FIGS. 2A-D show schematic diagrams of different extension modules according to an embodiment.

For instance, the extension module 51 shown in FIG. 2A comprises four ports 56 which can connect to the four auxiliary ports 41-44 of the RF module(s) 11, 21. The extension module 51 further comprises electrical or mechanical controlled switches 55 which can either generate a respective bypass between the ports 56 connected to the first and second auxiliary port 41, 42, and/or between the ports 56 connected to the third and fourth auxiliary port 43, 44 of an RF module. However, the switches 55 can also connect respective external ports 54 to the first and fourth auxiliary port 41, 44. The external ports 54 could be connected to a further external module or to another element, such as a signal or a noise source. Thus, the extension module 51 in FIG. 2A can offer an electrical or mechanical controlled bypass for further external modules.

Figure 2B:
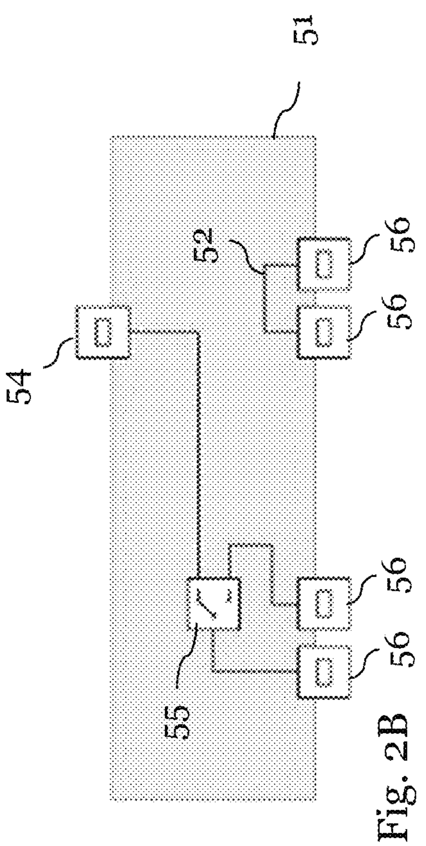

The extension module 51 shown in FIG. 2B, may also provide an electrical or mechanical controlled bypass for external sources (e.g., noise sources, signal sources). Thereby, a switch 55 can switch between a connection between two ports 51 connected to the third and fourth auxiliary port 43, 44 and a connection of the fourth auxiliary port 44 with an external port 54.

When connected to a Tx module, the external port 54 can be a feeding port configured to receive an RF signal; and the connected RF module 11 (e.g., a Tx module) can be configured to transmit the thus received RF signal to its RF port. Alternatively, when connected to an RX module, the external port 54 can be a receiving port configured to output an RF signal which is transmitted via the signal path of the Rx module.

Figure 2C:
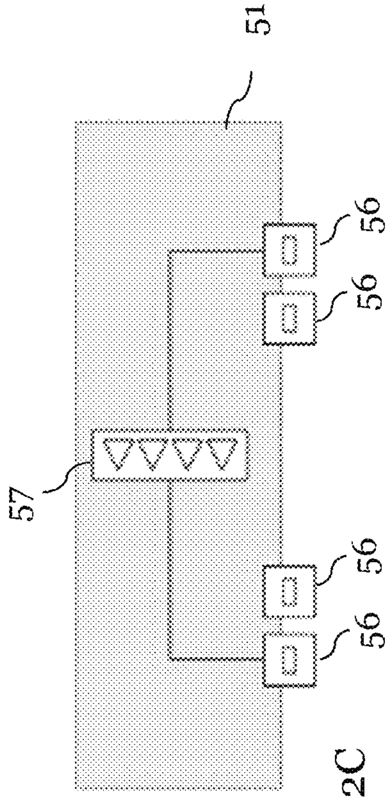

FIG. 2C shows an extension module 51 which is a high output power module. This module 51 comprises an amplifier unit 56 (e.g., comprising one or more amplifiers) which can be inserted and/or connected to the signal path of the RF module. For instance, the extension module 51 in FIG. 2C can be connected to a Tx module to increase an output level of a Tx signal.

Alternatively, an extension module 51 could comprise an attenuator and/or an LNA, e.g. for connecting to an Rx module.

For instance, by connecting such an extension module 51 to an Rx or Tx module, the performance of the RX/Tx module can be enhanced without reducing its functionality. Thus, the RF module(s) 11, 21 do not have to be re-designed when a new DUT with higher performance requirements for the power output stage is measured.

Figure 2D:
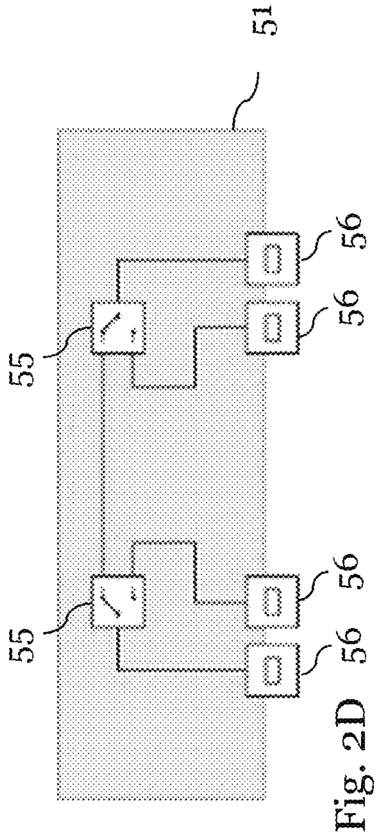

FIG. 2D shows an extensions module 51 which allows for switching between a connection to an electronic device 18, 28 (e.g., a power amplifier unit) of a connected RF module and a bridging element arranged for bypassing the electronic device 18, 28 by directly connecting the first and fourth auxiliary port 41, 44 of the RF module.

When connected to an RX module, the extension modules 51 can for instance be used to improve the performance of a low noise amplifier, to bypass an LNA to increase an input level, or to connect an additional attenuator to reduce an input level.

In case of an RF module with a plurality of auxiliary ports 41-44, preferably four auxiliary ports, which are connected to a signal path, the extension modules can be used to bypass parts of the signal path (e.g., a power amplifier in TX or LNA in RX).

Furthermore, a single extension module 51 can offer several functionalities by being design as a turnover plate, which can be dismounted for "reconfiguration", rotated around its own axis and re-mounted on the RF module.

The extension modules 51 connected to the first and second RF module 11, 21 in FIG. 1 are examples for extension modules with such turnover plate designs. For instance, in the currently mounted configuration, the extension modules 51 connect respective bridging elements 52, 53 to the first and second auxiliary ports 41, 42 and to the third and fourth auxiliary ports 43, 44 of the RF modules 11, 21. In this configuration, the electronic device 18, 28 of each module is connected to the respective signal path 13, 23.

However, when turning around and mounting the extension modules 51 via its RF ports on the opposite side, a further bridging 58 element connects the respective first and the fourth auxiliary ports 41, 44. This further bridging element 58 forms a bypass element for bypassing the electronic device 18, 28 (i.e., the electronic device is not connected to the signal path 13, 23 over with the RF signal is forwarded). In this way, the electronic device 18, 28 can be switched in or out of the signal path 13, 23.

When using more complex modules on the additional auxiliary ports 41-44, an electrically controllable switching is also possible.

Preferably, the extension modules 51 can be swapped during operation of the RF system 10. Hereby, during operation means that the DUT does not have to be disconnected (i.e., from the third RF module 31) when swapping of the extension module(s) 51.

Furthermore, the RF modules 11, 21 can be configured to automatically detect a connected extension module 51. During operation, new or additional options in the software of the RF modules 11, 21 or the test and/or measurement device can then be activated for adapting of the system 10 on-the-fly.

Figure 3:
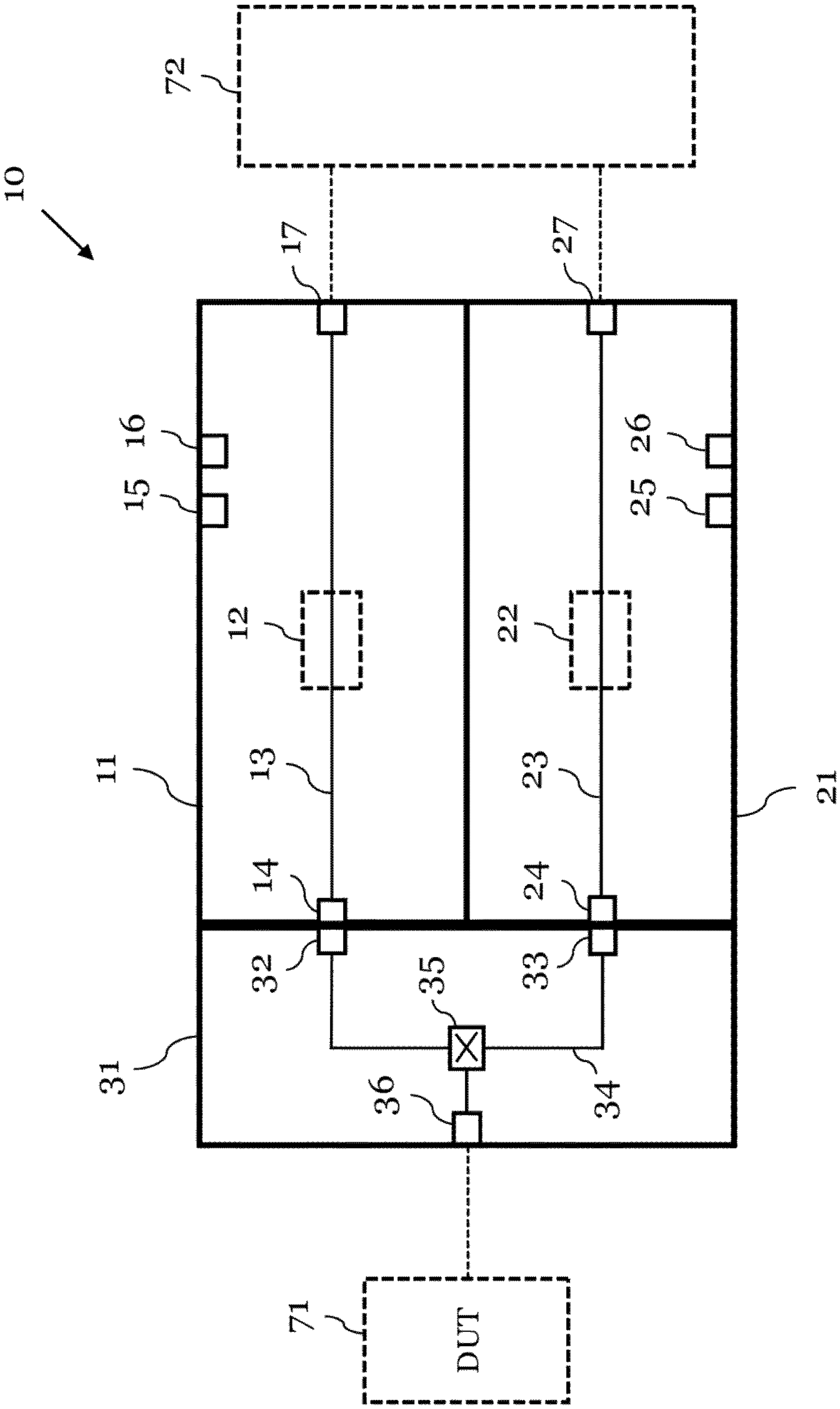
FIG. 3 shows a schematic diagram of a configurable RF system according to an embodiment.

FIG. 3 shows a schematic diagram of the configurable and RF system 10 according to an embodiment. The system 10 shown in FIG. 3 can be identical to the system shown in FIG. 1. The extension modules 51 and auxiliary ports 41-44 are not shown in FIG. 3.

The RF system 10 shown in FIG. 3 comprises: the first RF module 11, and the second RF module 21 which is attached to the first RF module 11. Each of the first and the second RF module 11, 21 can comprise an RF circuitry 12, 22, the signal path 13, 23, in particular a waveguide, and the RF port 14, 24 connected to the respective signal path 13, 23. The RF port 14 of the first RF module 11 and the RF port 24 of the second RF module 21 can be spaced apart at a predetermined distance and oriented to enable a connection to the third RF module 31 of the configurable RF system 10.

The configurable RF system 10 can be a frontend system which is arranged between the test and/or measurement device 72 and the DUT 71. In particular, each of the first and the second RF module 11, 21 can comprise a dedicated RF port 17, 27 for connecting to a RF port of the test and/or measurement device.

Each of the RF ports 14, 24, 17, 27 of the first and/or the second RF module can be designed as or can comprise a waveguide flange. Alternatively, each of these interfaces can also be designed as or comprise coaxial interfaces.

Furthermore, each of the first and/or the second RF module 11, 21 may comprise a respective data interface 15, 25. This data interface can be a USB interface.

For instance, the RF modules 11, 21 can receive control commands via the data interface. In an example, an RF module 11, 21 can activate or switch an RF element (e.g., an amplifier, an attenuator, a filter etc.) into the signal path when receiving a respective control command. In this way, the RF modules 11, 21 can be configured or adapted for a specific measurement without having to manually change the measurement setup.

The first and/or the second RF module 11, 21 may further each comprise a respective power supply interface 16, 26 (e.g., a supply voltage interface).

The data interfaces 15, 25 and/or the power supply interfaces 16, 26 can be connected to the test and/or measurement device 72.

Furthermore, also the third RF module 31 may comprise a data interface and/or a power supply interface. For instance, via these interfaces, the third RF module 31 can receive electrical energy, e.g. from the first or second RF module 11, 21 or from the test and/or measurement device 72 and/or can supply energy to further RF modules.

The RF circuitry 12, 22 of the first and/or the second RF module 11, 21 can be connected to the signal path 13, 23 of the respective module 11, 21 and may comprise one or more elements which are configured to adapt and/or condition RF signals that are transmitted via the signal path 13, 23. For instance, each of RF circuitries 12, 22 may comprises at least one of: an RF amplifier, an RF mixer, an RF attenuator, an RF switch, an RF isolator, a combiner, a coupler, a doubler, a multiplier, a circulator, a phase shifter, and/or a delay line. The electronic device 18, 28 of the first and/or second RF module 11, 21 may be a component of the respective RF circuitry 12, 22 of the module.

The test and/or measurement device 72 can be a device which generates signals and forwards them to the RF system 10 (e.g., a signal generator or VNA) or a device which receives signals from the RF system (e.g., a spectrum or network analyzer). A configurable RF system 10, which comprises an Rx and a Tx receiver, can be used as a frontend system for both of these types of devices.

For instance, the RF port of the TX module (which forms an output port) and the RF port of the RX module (which forms an input port) can be connected to the third RF module 31 (e.g., without opening the modules). The third RF module 31 can then selectively connect any one of these ports 14, 24 with the DUT 71.

Alternatively, Both the First and the Second RF Module 11, 21 can be Either Rx or Tx Modules.

The third RF module 31 may comprise at least three RF ports 32, 33, 36. The three RF ports 32, 33, 36 can be designed as or can comprise waveguide flanges.

In particular, the third RF module 31 comprises two RF ports 32, 33 which are spaced apart at the predetermined distance and are designed for connecting to the RF ports 14, 24 of the first and the second RF module 11, 21, and a further RF port 36 which is arranged for being connected to the DUT 71.

The third RF module may further comprise at least one element 35 which connects to the three RF ports 32, 33, 36 via a signal path 34, in particular a waveguide (e.g., a rectangular metallic waveguide).

The at least one element 35 can comprise a switch, for instance a mechanically or electrically controllable switch, a coupler, a combiner, a splitter, or a multiplexer.

The third RF module 31, can be configured to switch the RF ports 14, 24 of the first and second RF module 11, 21 to a single further port 36, which can be connected to the DUT.

For instance, if the first and the second RF module 11, 21 are an Rx and a Tx module, respectively, than the third RF module 31 can selectively switch its further RF port 36 (that can be connected to a DUT) to the Rx or the Tx module. In this way, a half-duplex system can be released. If the element 35 is instead a coupler, a combiner or a splitter, the system 10 can even form a full-duplex system.

If the first and the second RF module 11, 21 are both Tx modules, the third RF module 31 can generate a two-tone signal by combining respective RF signals received via the RF ports 32, 33.

The third RF module 31 may comprise further functionality, such as a digital interface with characterization data stored in the module for signal correction, transmission or reflection measurements (as a function of frequency).

For instance, the third RF module 31 may further comprise a digital data storage which is configured to store device data referring to the third RF module 31. The data storage can be coupled to the digital interface (e.g., a data interface) of the third RF module 31, wherein the digital interface is adapted to couple the third RF module 31 with an external communication partner (e.g., the test and/or measurement device). For example, the device data stored in the digital data storage may comprise a unique identifier for the third RF module 31 and/or data characterizing the RF signal path 34 and the RF port(s) 32, 33, 36 of the third RF module 31. The digital data storage may further receive control data for controlling the third RF module 31 and/or updated device data via the digital interface. The updated device data can be store the updated device data.

The third RF module 31 can be detachably attached to the first and the second RF module 11 21. For example, the third RF module 31 can be attached to the first and the second RF module 11, 21 by means of a plug-in connection, a screw connection or a magnetic connection.

In an example, this connection is established by screwing the respective waveguide flanges of the RF ports 14, 24 of the of the first and second RF module 11, 21 to the flanges complementary RF ports 32, 33 of the third RF module 31.

In addition, the third RF module 31 can be removed from the first and the second RF module 11, 21 to use the first and second RF modules 11, 21 separately and/or to improve the performance of these modules 11, 21 (e.g., by reducing an attenuation of both modules). In this way, for example, a noise figure of an Rx module and an output power of a Tx module can be improved.

Furthermore, the RF system 10 may comprise an external multiplexer module. This external multiplexer module can be used instead of or in addition to the third RF module 31 and can enable switching between a plurality of further RF ports of the third RF module 31, e.g. a number of input and output ports for connecting to one or more DUTs. These further RF ports can be bidirectional ports. For instance, multiple DUTs could be connected to the further RF ports, e.g. two or more antennas for OTA measurements with cross and co-polarization.

For example, the third RF module 31 may comprise an active or passive impedance tuner. The impedance tuner can allow a user to adapt an impedance value and to carry out impedance specific measurements. For instance, source and/or load pull measurements can be carried out in this way without having to connect additional external impedance tuners.

The first and the second RF modules 11, 21 can be arranged at a well-defined distance and orientation to each other and can be attached to each other (e.g., screwed to each other). As a consequence the RF ports 14, 24 of the first and second RF module 11, 21 can be spaced apart at the predetermined distance and orientation with a high tolerance of 100 μm or less. This is high tolerance is especially important when the RF ports 14, 24 are waveguide-interfaces (e.g., waveguide flanges) which should be aligned as precisely as possible (i.e., without offset) to the complementary RF ports 32, 33 of the third RF module 31, when the third RF module 31 is attached to the first and the second RF module 11, 21.

For instance, the alignment of the RF ports 14, 24 of the first and second RF module 11, 21 fulfills the requirements for the max. allowed misalignment according to IEEE Std 1785.2-2016.

Figure 4:
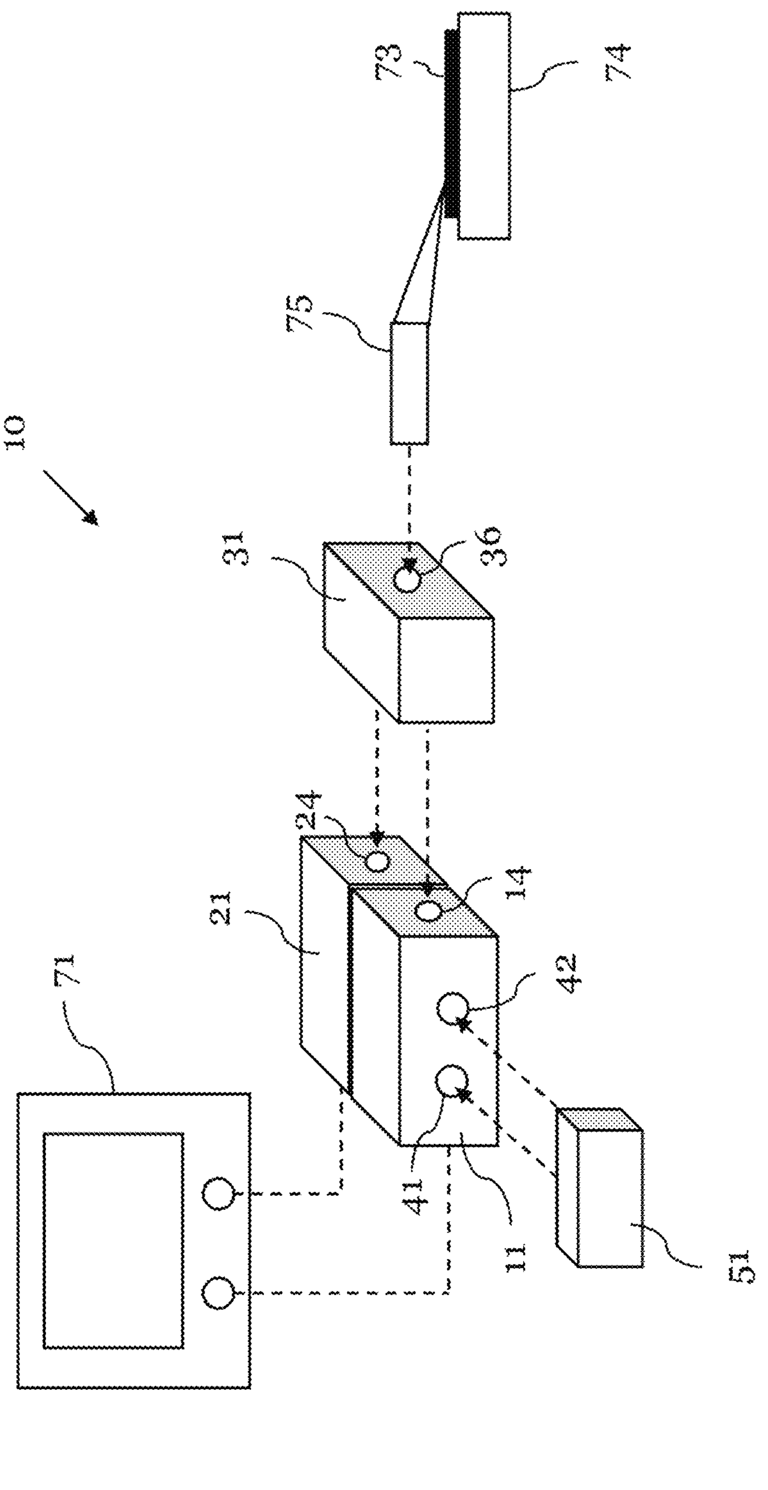
FIG. 4 shows a schematic diagram of a configurable RF system according to an embodiment.

FIG. 4 shows a schematic diagram of the configurable RF system 10 according to an embodiment. Thereby, the RF system 10 is used as a frontend of a test and/or measurement device 72 (e.g., a signal source or signal analyzer) which is used to analyze a DUT on a wafer. The DUT can be an MMIC or thin fil circuit on the wafer 73 which can be placed on a chuck 74 of a wafer prober.

The system shown in FIG. 4 comprises the first and second RF module that are connected to an RF port of the test and/or measurement device 72.

An extension module 51 is connected to at least two auxiliary ports 41, 42 of the first RF module 11. Further both RF modules 11, 21 are connected to the third RF module 31 via their (main) RF ports 14, 24. The third RF module (e.g., an external combiner module for combining RF modules 11 and 21) is in turn connected to the DUT. For instance, third RF module 31 is electrically connected to the DUT via a tip of a wafer prober 75.

All features described above or features shown in the figures can be combined with each other in any advantageous manner within the scope of the invention.

The invention claimed is:

1. A configurable radio frequency (RF) system, comprising:
- a first RF module which comprises a signal path and an RF port;
- wherein the RF port is arranged for being connected to a further RF module or to a device-under-test (DUT);
- wherein the first RF module further comprises at least a first and a second auxiliary ports which are accessible from outside the first RF module;
- wherein the first and the second auxiliary ports are arranged for being connected to each other via: a first bridging element or a first extension module of the configurable RF system;
- wherein the signal path is connected to the RF port and passes through:
  - the first auxiliary port,
  - the first bridging element or the first extension module, and
  - the second auxiliary port;
- wherein the first RF module comprises at least a third and a fourth auxiliary port which are accessible from outside the first RF module;
- wherein the third and the fourth auxiliary port are arranged for being connected to each other via: a second bridging element or the first extension module or a second extension module of the configurable RF system;
- wherein the signal path further passes through:
  - the third auxiliary port,
  - the second bridging element or the first extension module or the second extension module, and
  - the fourth auxiliary port.

2. The configurable RF system of claim 1
- wherein at least a part of the signal path between the first auxiliary port and the fourth auxiliary port runs through the first RF module.

3. The configurable RF system of claim 2,
- wherein the first RF module comprises an electronic device, in particular an amplifier unit;
- wherein the part of the signal path that runs through the first RF module passes through the electronic device.

4. The configurable RF system of claim 1,
- wherein the first extension module comprises at least one of the following elements: the first bridging element, an amplifier stage, a switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, a combiner, and/or a DUT port.

5. The configurable RF system of claim 1,
- wherein the first extension module comprises a feeding port configured to receive an RF signal; and
- wherein the first extension module is configured to transmit the RF signal to the RF port of the first RF-module.

6. The configurable RF system of claim 1,
- wherein the first RF module is a transmitter module and/or a receiver module.

7. The configurable RF system of claim 1,
- wherein the first extension module is removably attached to the first RF module by means of a plug-in connection, a screw connection or a magnetic connection.

8. The configurable RF system of claim 1,
- wherein the first RF module comprises a plurality of sub-modules.

9. The configurable RF system of claim 1,
- wherein the first bridging element or the first extension module can be swapped with a different bridging element or extension module during operation of the configurable RF system.

10. A configurable radio frequency (RF) system, comprising:
- a first RF module which comprises a signal path and an RF port;
- wherein the RF port is arranged for being connected to a further RF module or to a device-under-test (DUT);
- wherein the first RF module further comprises at least a first and a second auxiliary ports which are accessible from outside the first RF module;
- wherein the first and the second auxiliary ports are arranged for being connected to each other via: a first bridging element or a first extension module of the configurable RF system;
- wherein the signal path is connected to the RF port and passes through:
  - the first auxiliary port,
  - the first bridging element or the first extension module, and
  - the second auxiliary port;
- a second RF module which comprises a further signal path and a further RF port;
- wherein the further RF port of the second RF module is arranged for being connected to the further RF module or to the DUT or to another DUT;
- wherein the second RF module further comprises at least a further first and a further second auxiliary port which are accessible from outside the second RF module;
- wherein the further first and the further second auxiliary port are arranged for being connected to each other via: a third bridging element or a third extension module of the configurable RF system;
- wherein the further signal path is connected to the further RF port and passes through:

the further first auxiliary port,
the third bridging element or the third extension module, and
the further second auxiliary port.

11. The configurable RF system of claim 10,
wherein the second RF module comprises at least a further third and a further fourth auxiliary port which are accessible from outside the second RF module;
wherein the further third and the further fourth auxiliary port are arranged for being connected to each other via: a fourth bridging element or the third extension module or a fourth extension module of the configurable RF system;
wherein the further signal path further passes through:
the further third auxiliary port,
the fourth bridging element or the third extension module or the fourth extension module, and
the further fourth auxiliary port.

12. The configurable RF system of claim 11,
wherein at least a part of the further signal path between the further first auxiliary port and the further fourth auxiliary port runs through the second RF module.

13. The configurable RF system of claim 12,
wherein the second RF module comprises a further electronic device, in particular an amplifier unit;
wherein the part of the further signal path that runs through the second RF module passes through the further electronic device.

14. The configurable RF system of claim 10,
wherein the third extension module comprises at least one of the following elements: the third bridging element, an amplifier stage, a switching unit configured to connect at least one of the auxiliary ports to another auxiliary port, an attenuator unit, a filter unit, a phase shifter, an isolator, a circulator, a power detector, a mixer, a signal and/or noise source, a modulator, a coupler unit, a splitter, a combiner, and/or a DUT port.

15. The configurable RF system of claim 10,
wherein the third extension module comprises a receiving port configured to output an RF signal which is transmitted via the further signal path of the second RF module.

16. The configurable RF system of claim 10,
wherein the first RF module and the second RF module are arranged in a common housing or within separate housings.

17. The configurable RF system of claim 10,
wherein the first RF module further comprises at least one of: a data interface, a coaxial interface, a supply voltage interface; and/or
wherein the second RF module comprises at least one of: a data interface, a coaxial interface, a supply voltage interface.

18. The configurable RF system of claim 10,
wherein the first and the second RF module are screwed and/or clipped together; and/or
wherein the configurable RF system comprises a data connection and/or a supply voltage connection which connects the first RF module with the second RF module.

* * * * *